(12) United States Patent
Block et al.

(10) Patent No.: US 7,343,193 B2
(45) Date of Patent: Mar. 11, 2008

(54) BACKGROUND SUPPRESSION METHOD FOR TIME-RESOLVED MAGNETIC RESONANCE ANGIOGRAPHY

(75) Inventors: Walter Block, Madison, WI (US); Arjun Arunachalam, Madison, WI (US)

(73) Assignee: Wisconsin Alumni Research Foundation, Madison, WI (US)

( * ) Notice: Subject to any disclaimer, the term of this patent is extended or adjusted under 35 U.S.C. 154(b) by 762 days.

(21) Appl. No.: 10/772,525

(22) Filed: Feb. 5, 2004

(65) Prior Publication Data

US 2004/0254447 A1 Dec. 16, 2004

Related U.S. Application Data

(60) Provisional application No. 60/478,891, filed on Jun. 16, 2003.

(51) Int. Cl.
*A61B 5/05* (2006.01)
(52) U.S. Cl. .................. 600/410; 600/420; 600/419; 324/306; 324/307
(58) Field of Classification Search ................ 600/410, 600/420; 324/603, 307
See application file for complete search history.

(56) References Cited

U.S. PATENT DOCUMENTS

| | | | | |
|---|---|---|---|---|
| 5,417,213 A | * | 5/1995 | Prince | 600/413 |
| 5,603,322 A | * | 2/1997 | Jesmanowicz et al. | 600/410 |
| 5,792,056 A | * | 8/1998 | Prince | 600/420 |
| 5,827,187 A | * | 10/1998 | Wang et al. | 600/419 |
| 5,830,143 A | * | 11/1998 | Mistretta et al. | 600/420 |
| 5,933,540 A | * | 8/1999 | Lakshminarayanan et al. | 382/260 |
| 6,073,042 A | * | 6/2000 | Simonetti | 600/420 |
| 6,381,486 B1 | | 4/2002 | Mistretta et al. | |
| 6,477,399 B2 | * | 11/2002 | Biswal et al. | 600/410 |
| 6,487,435 B2 | * | 11/2002 | Mistretta et al. | 600/420 |
| 6,490,472 B1 | * | 12/2002 | Li et al. | 600/410 |
| 6,556,856 B1 | * | 4/2003 | Mistretta et al. | 600/420 |
| 6,980,875 B1 | * | 12/2005 | Stromberg | 700/110 |
| 2002/0082496 A1 | * | 6/2002 | Kuth | 600/410 |
| 2004/0027127 A1 | * | 2/2004 | Mills | 324/317 |
| 2004/0204643 A1 | * | 10/2004 | Jesmanowicz | 600/410 |

OTHER PUBLICATIONS

Yousef Mazaheri, et al, Combined Time-Resolved and High-Spatial-Resolution 3D MRA Using an Extended Adaptive Acquisition, Journ. of Mag. Reson. Imaging, 15:291-301 (2002).

(Continued)

*Primary Examiner*—Brian L. Casler
*Assistant Examiner*—Iman Kenneth Kholdebarin
(74) *Attorney, Agent, or Firm*—Quarles & Brady LLP (57) ABSTRACT

A 3D projection reconstruction pulse sequence is employed during a CEMRA dynamic study to acquire a time course series of k-space data sets. Signals from non-vascular voxels are suppressed by reconstructing a corresponding series of low resolution images using the centers of the acquired k-space data sets, and measuring the degree to which the signal behavior of voxels therein differ from a model of unwanted signal. Signals from voxels which do not differ from the model are suppressed and the resulting filtered low resolution images are transformed back to k-space and combined with the originally acquired peripheral k-space data to form complete, filtered k-space data sets from which images may be reconstructed.

14 Claims, 9 Drawing Sheets

OTHER PUBLICATIONS

A Arunachalama et al, Post-Processing Background Suppression in Time-Resolved MRA Without Mask Acquisitions or Operator Intervention, Proc. Intl. Soc. Mag. Reson. Med. 11 (2003) p. 781.

Michael Bock et al, Separation of Arteries and Veins and 3D MR Angiogrpahy Using Correlation Analysis, Mag. Reson. in Med. 43:481-487 (2000).

Anne L. Martel, et al, Separating Arterial and Venous Components From 3D Dynamic Contrast-Enhanced MRI Studies Using Factor Analysis, Mag. Reson. in Med. 49:928-933 (2003).

Barger, et al; Time-Resonved Contrast-Enhanced Imaging With Isotropic Resolution and Broad Coverage Using an Undersampled 3D Projection Trajectory; Magnetic Resonance in Medicine, 48:297-305 (2002).

* cited by examiner

BACKGROUND SUPPRESSION METHOD FOR TIME-RESOLVED MAGNETIC RESONANCE ANGIOGRAPHY

CROSS-REFERENCE TO RELATED APPLICATIONS

This application is based on U.S. Provisional Patent Application Ser. No. 60/478,891 filed on Jun. 16, 2003 and entitled "BACKGROUND SUPPRESSION METHOD FOR TIME-RESOLVED MAGNETIC RESONANCE ANGIOGRAPHY."

STATEMENT REGARDING FEDERALLY SPONSORED RESEARCH

This invention was made with United States Government support awarded by NIH grant HL62425. The United States has certain rights in this invention.

BACKGROUND OF THE INVENTION

The field of the invention is magnetic resonance angiography ("MRA"), and particularly, studies of the human vasculature using contrast agents which enhance the NMR signals.

Magnetic resonance angiography (MRA) uses the nuclear magnetic resonance (NMR) phenomenon to produce images of the human vasculature. When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, $M_z$, may be rotated, or "tipped", into the x-y plane to produce a net transverse magnetic moment $M_t$. A signal is emitted by the excited spins, and after the excitation signal $B_1$ is terminated, this signal may be received and processed to form an image.

When utilizing these signals to produce images, magnetic field gradients ($G_x$, $G_y$ and $G_z$) are employed. Typically, the region to be imaged is scanned by a sequence of measurement cycles in which these gradients vary according to the particular localization method being used. Each measurement is referred to in the art as a "view" and the number of views determines the resolution of the image. The resulting set of received NMR signals, or views, or k-space samples, are digitized and processed to reconstruct the image using one of many well known reconstruction techniques. The total scan time is determined in part by the number of measurement cycles, or views, that are acquired for an image, and therefore, scan time can be reduced at the expense of image resolution by reducing the number of acquired views.

To enhance the diagnostic capability of MRA a contrast agent such as gadolinium can be injected into the patient prior to the MRA scan. As described in U.S. Pat. No. 5,417,213 contrast enhanced (CE) MRA attempts to acquire the central k-space views at the moment the bolus of contrast agent is flowing through the vasculature of interest. Collection of the central lines of k-space during peak arterial enhancement is key to the success of a CEMRA exam. If the central lines of k-space are acquired prior to the arrival of contrast, severe image artifacts can limit the diagnostic information in the image. Alternatively, arterial images acquired after the passage of the peak arterial contrast are sometimes obscured by the enhancement of veins. In many anatomic regions, such as the carotid or renal arteries, the separation between arterial and venous enhancement can be as short as 6 seconds.

As indicated above, the acquisition of MRA data is timed such that the central region of k-space is acquired as the bolus of contrast agent arrives in the arteries of interest. The ability to time the arrival of contrast varies considerably and it is helpful in many applications to acquire a series of MRA images in a dynamic study which depicts the separate enhancement of arteries and veins. A temporal series of images is also useful for observing delayed vessel filling patterns caused by disease. This requirement has been partially addressed by acquiring a series of time resolved images using a 3D "Fourier" acquisition as described by Korosec F., Frayne R, Grist T., Mistretta C., "Time-Resolved Contrast-Enhanced 3D MR Angiography", *Magn. Reson. Med.* 1996; 36:345-351 and in U.S. Pat. No. 5,713,358. More recently, time-resolved MRA images have been acquired using a three-dimensional projection reconstruction method as described in U.S. Pat. No. 6,487,435 entitled "Magnetic Resonance Angiography Using Undersampled 3D Projection Imaging".

With CEMRA image studies the usual practice is to acquire at least one image prior to the injection of contrast into the patient. This pre-contrast image is used as a mask that is subtracted from the contrast enhanced images to remove the signal from non-vascular tissues such as fat and bone. While this technique can be very effective, it does have two disadvantages. First, it extends the time of the scan and it requires that the patient be immobilized so that the mask image can be precisely registered with the contrast enhanced images from which it is subtracted. Any misregistration results in distracting image artifacts that may interfere with the diagnostic utility of the angiogram. The subtraction of two images also increases the standard deviation of the noise signal, reducing the signal-to-noise ratio (SNR) by the square root of 2.

SUMMARY OF THE INVENTION

The present invention is a method for suppressing signal from non-vascular tissues in a contrast enhanced magnetic resonance angiogram (CEMRA) without the need for a mask image and without the need for manual intervention. More particularly, the method includes acquiring a series of NMR time course images as contrast agent passes through arteries of interest; reconstructing a corresponding series of low resolution images using a central k-space portion of the time course images; producing a mask image by measuring the behavior of the low resolution image voxels with respect to a model; applying the mask image to the low resolution images to produce low resolution vascular images; and reconstructing an image using data derived from a low resolution vascular image and peripheral k-space data from a corresponding low resolution image.

A general object of the invention is to produce a CEMRA image without the need for acquiring and subtracting a mask image. A mask image is created from information in the series of acquired low resolution images and a model of non-vascular behavior during the dynamic study. A model time course of static signals and unwanted signals from background tissue are produced. The static signal is modeled using a constant n×1 vector, where n is the number of images in the dynamic study. Unwanted background tissues produce a signal during the time course which exhibits a linear increase in intensity, and this is modeled by a ramp function of dimension n×1. These two vectors form two columns in an n×2 matrix [A].

The foregoing and other objects and advantages of the invention will appear from the following description. In the description, reference is made to the accompanying drawings which form a part hereof, and in which there is shown by way of illustration a preferred embodiment of the invention. Such embodiment does not necessarily represent the full scope of the invention, however, and reference is made therefore to the claims herein for interpreting the scope of the invention.

DESCRIPTION OF THE PREFERRED EMBODIMENT

Figure 1:
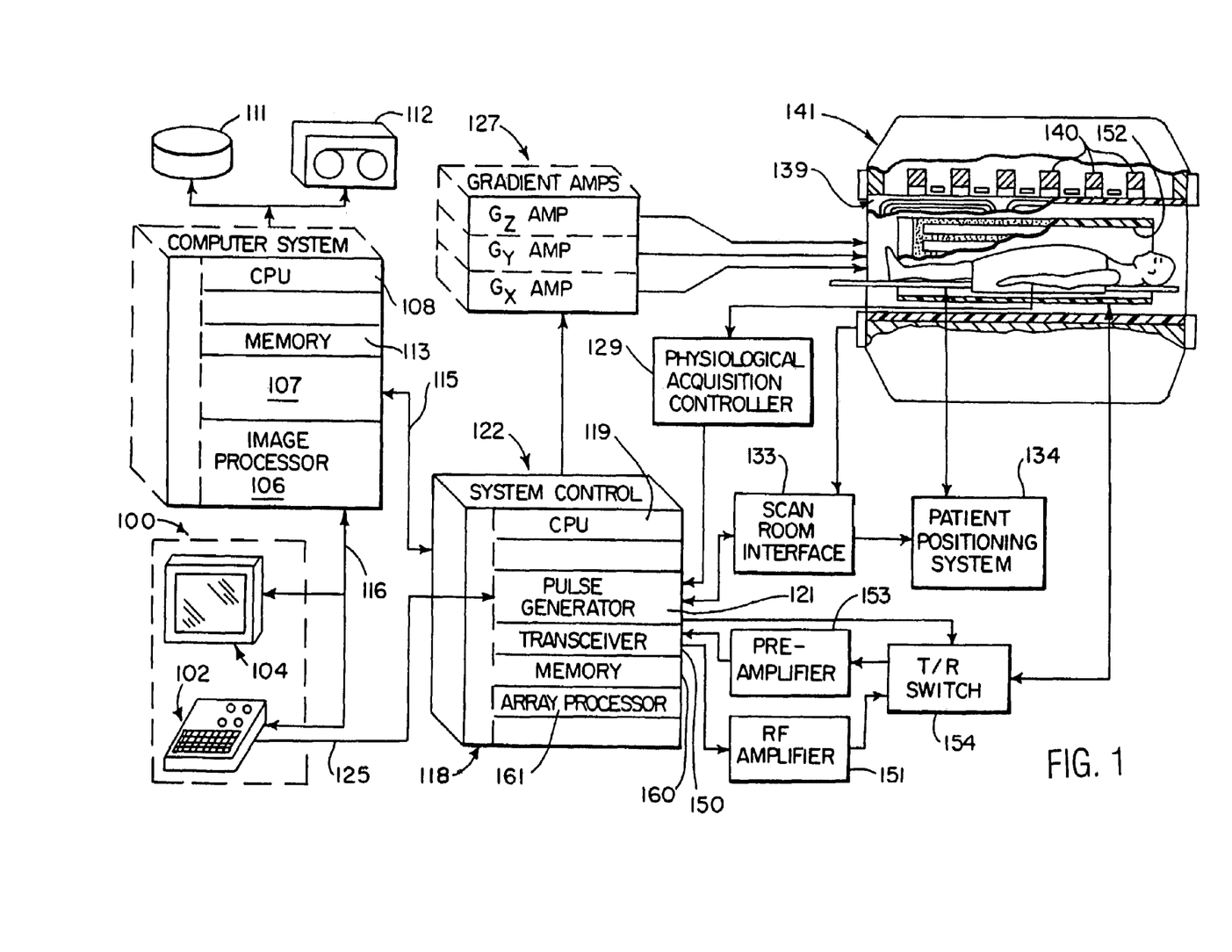
FIG. 1 is a block diagram of an MRI system which employs the present invention.

Referring first to FIG. 1, there is shown the major components of a preferred MRI system which incorporates the present invention. The operation of the system is controlled from an operator console 100 which includes a keyboard and control panel 102 and a display 104. The console 100 communicates through a link 116 with a separate computer system 107 that enables an operator to control the production and display of images on the screen 104. The computer system 107 includes a number of modules which communicate with each other through a backplane. These include an image processor module 106, a CPU module 108 and a memory module 113 for storing image data arrays. The computer system 107 is linked to a disk storage 111 and a tape drive 112 for storage of image data and programs, and it communicates with a separate system control 122 through a high speed serial link 115.

The system control 122 includes a set of modules connected together by a backplane. These include a CPU module 119 and a pulse generator module 121 which connects to the operator console 100 through a serial link 125. It is through this link 125 that the system control 122 receives commands from the operator which indicate the scan sequence that is to be performed. The pulse generator module 121 operates the system components to carry out the desired scan sequence. It produces data which indicates the timing, strength and shape of the RF pulses which are to be produced, and the timing of and length of the data acquisition window. The pulse generator module 121 connects to a set of gradient amplifiers 127, to indicate the timing and shape of the gradient pulses to be produced during the scan. The pulse generator module 121 also receives patient data from a physiological acquisition controller 129 that receives signals from a number of different sensors connected to the patient, such as ECG signals from electrodes or respiratory signals from a bellows. And finally, the pulse generator module 121 connects to a scan room interface circuit 133 which receives signals from various sensors associated with the condition of the patient and the magnet system. It is also through the scan room interface circuit 133 that a patient positioning system 134 receives commands to move the patient to the desired position for the scan.

The gradient waveforms produced by the pulse generator module 121 are applied to a gradient amplifier system 127 comprised of $G_x$, $G_y$, and $G_z$ amplifiers. Each gradient amplifier excites a corresponding gradient coil in an assembly generally designated 139 to produce the magnetic field gradients used for position encoding acquired signals. The gradient coil assembly 139 forms part of a magnet assembly 141 which includes a polarizing magnet 140 and a whole-body RF coil 152. A transceiver module 150 in the system control 122 produces pulses which are amplified by an RF amplifier 151 and coupled to the RF coil 152 by a transmit/receive switch 154. The resulting signals radiated by the excited nuclei in the patient may be sensed by the same RF coil 152 and coupled through the transmit/receive switch 154 to a preamplifier 153. The amplified NMR signals are demodulated, filtered, and digitized in the receiver section of the transceiver 150. The transmit/receive switch 154 is controlled by a signal from the pulse generator module 121 to electrically connect the RF amplifier 151 to the coil 152 during the transmit mode and to connect the preamplifier 153 during the receive mode. The transmit/receive switch 154 also enables a separate RF coil (for example, a head coil or surface coil) to be used in either the transmit or receive mode.

The NMR signals picked up by the RF coil 152 are digitized by the transceiver module 150 and transferred to a memory module 160 in the system control 122. When the scan is completed and an entire array of data has been acquired in the memory module 160, an array processor 161 operates to Fourier transform the data into an array of image data. This image data is conveyed through the serial link 115 to the computer system 107 where it is stored in the disk memory 111. In response to commands received from the operator console 100, this image data may be archived on the tape drive 112, or it may be further processed by the image processor 106 and conveyed to the operator console 100 and presented on the display 104.

To practice a preferred embodiment of the invention NMR data is acquired in a 3D spherical k-space coordinate system. The sampling method consists of a series of evenly spaced projections with all projections going through the center of k-space as described in the above cited U.S. Pat. No. 6,487,435 which is incorporated herein by reference.

Figure 2:
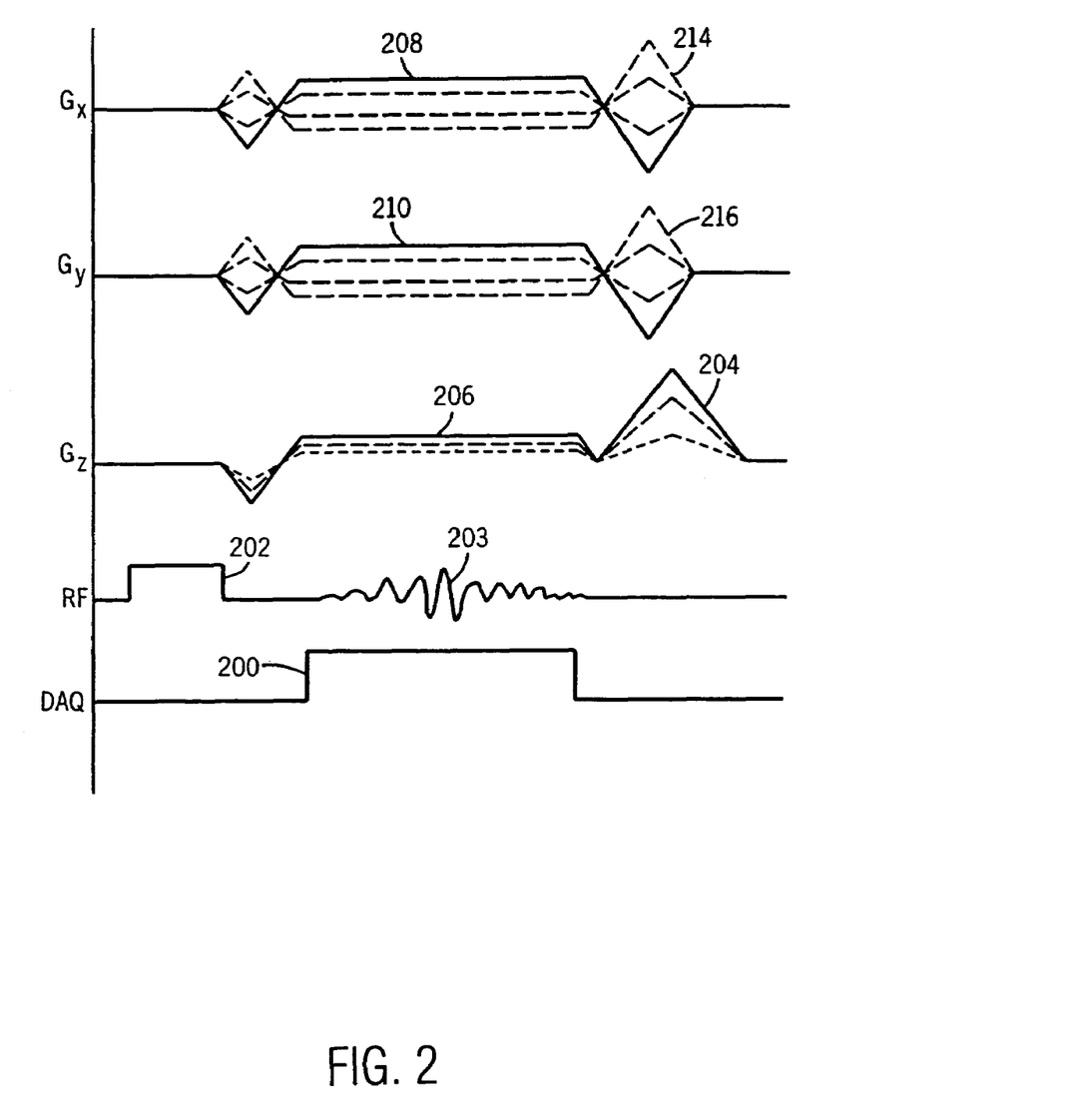
FIG. 2 is a graphic illustration of a preferred pulse sequence for directing the MRI system of FIG. 1 to acquire a 3D projection reconstruction image.

A pulse sequence used to acquire 3D projections is shown in FIG. 2. The sequence is implemented on the above described MRI system equipped with a high-performance gradient subsystem (40 mT/m maximum amplitude and 150 T/m/sec maximum slew rate). Either full-echo or partial-echo readouts can be performed during a data acquisition window 200. If partial echo is chosen, the bottom half of k-space ($k_z<0$) is only partially acquired. Because of the large FOV in all directions, a non-selective 200 μs radio-frequency (RF) pulse 202 can be used to produce transverse magnetization throughout the image FOV.

A gradient-recalled NMR echo signal 203 is produced by spins in the excited FOV and acquired in the presence of three readout gradients 206, 208 and 210. Since the k-space trajectory samples a radial line in k-space, the readout gradient waveforms $G_x$, $G_y$, and $G_z$ have a similar form. The direction of the radial line in k-space is determined by the relative amplitudes of each readout gradient. This symmetry is interrupted only by the need to spoil the sequence, which is accomplished by playing a dephasing gradient lobe 204. The area of the dephasing lobe 204 is calculated to satisfy the condition $$\int_0^{TR}(G_{dephase}(t)+G_{read}(t))dt = n \cdot k_{max} \quad (3)$$

where n is an integer $n \geq 2$. Because the $G_z$ readout gradient 206 is always positive on the logical z-axis, the time required for the spoiling gradient 204 is minimized by playing the dephasing lobe 204 only on $G_z$. The $G_x$ and $G_y$ readout gradients 208 and 210 are rewound by respective gradient pulses 212 and 214 to achieve steady state.

The readout gradient waveforms $G_x$, $G_y$, and $G_z$ are modulated during the scan to sample radial trajectories at different θ and φ angles. The angular spacing of θ and φ are chosen such that a uniform distribution of k-space sample points occurs at the peripheral boundary ($k_{max}$) of the sampled k-space sphere. Although several methods of calculating the distribution are known, a method which evenly distributes the projections by sampling the spherical surface with a spiral trajectory, with the conditions of constant path velocity and surface area coverage is used. For N total projections, the equations for the gradient amplitude as a function of projection number n are:

$$G_z = \frac{2n-1}{2N} \quad (4)$$

$$G_x = \cos(\sqrt{2N\pi}\sin^{-1}G_z(n))\sqrt{1-G_z(n)^2} \quad (5)$$

$$G_y = \sin(\sqrt{2N\pi}\sin^{-1}G_z(n))\sqrt{1-G_z(n)^2}. \quad (6)$$

In the preferred embodiment described herein N is set to one-third of the number of projections required to fully sample k-space at the periphery of the sampled sphere. This means that the region near the center of k-space is fully sampled, but periphery k-space is not. The readout gradient amplitudes for the $n^{th}$ pulse sequence in this series is given by equations (4), (5) and (6). While n can be indexed from 1 to N in monotonic order during the scan, it can be appreciated that other orders are possible.

After the scan is complete the data is saved in a raw, k-space image data set. In the preferred image reconstruction method, a regridding method is used to place the acquired data set on a 3D Cartesian grid. Such regridding methods are well known in the art and is described, for example, in J. Jackson et al, "Selection Of Convolution Function For Fourier Inversion Using Gridding," *IEEE Trans. Med. Imaging* 10, 473-478, 1991. The resulting 3D array of k-space data are density compensated with a $\rho^2$ filter, where ρ is the k-space radius of the data point being compensated. The ρ=0 point is weighted according to the finite sphere of volume that it samples, similar to the correction proposed for 2D projection filters. The kernel used for the regridding process is either a simple triangle function, which is computationally very fast, or a Kaiser-Bessel function, which has the advantage of reducing aliased energy from the regridding process.

The regridded k-space data may then be Fourier-transformed in all three directions into image space. If a partial echo was used for the acquisition, the missing data is synthesized with a 3D homodyne process such as that described by Noll and Nishimura, "Homodyne Detection In Magnetic Resonance Imaging," *IEEE Transactions on Medical Imaging*, Vol. 10, No. 2, June 1991 and in U.S. Pat. No. 5,243,284. The final images are divided by the Fourier transform of the convolution kernel to correct for low-frequency image intensity variations due to the regridding process. As will be described in detail below, before this final image reconstruction step is performed, the central region of k-space is filtered to suppress non-vascular signals.

It should be apparent to those skilled in the art that sampling trajectories other than the preferred straight line trajectory extending from one point on the k-space peripheral boundary, through the center of k-space to an opposite point on the k-space peripheral boundary may be used. As mentioned above, one variation is to acquire a partial NMR echo signal 203 which samples along a trajectory that does not extend across the entire extent of the sampled k-space volume. The missing samples are synthesized during the homodyne reconstruction described above. Another variation which is equivalent to the straight line projection reconstruction pulse sequence is to sample along a curved path rather than a straight line. Such pulse sequences are described, for example, in "Fast Three Dimensional Sodium Imaging", MRM, 37:706-715, 1997 by F. E. Boada, et al.

There are also alternative methods for reconstructing a 3D image from the acquired 3D k-space image data set. One alternative is a filtered backprojection method such as that described by F. Natterer, "The Mathmatics of Computerized Tomography", Teubner, Stuttgart, 1986. This is a method commonly used to reconstruct x-ray CT images.

The present invention is employed during a contrast enhanced dynamic study. As described in U.S. Pat. No. 5,713,358, rather than precisely timing the arrival of contrast into the vasculature being imaged, the strategy of the CEMRA dynamic study is to acquire a series of images during administration of the contrast agent. The physician is then able to select which image in the series best depicts the vasculature of interest. In addition to image quality and resolution, an important criteria in a CEMRA dynamic study is the rate at which images can be acquired. This is referred to as time resolution, and studies with higher time resolution increase the probability that an image with peak contrast in the vasculature of interest will be acquired.

Figure 3:
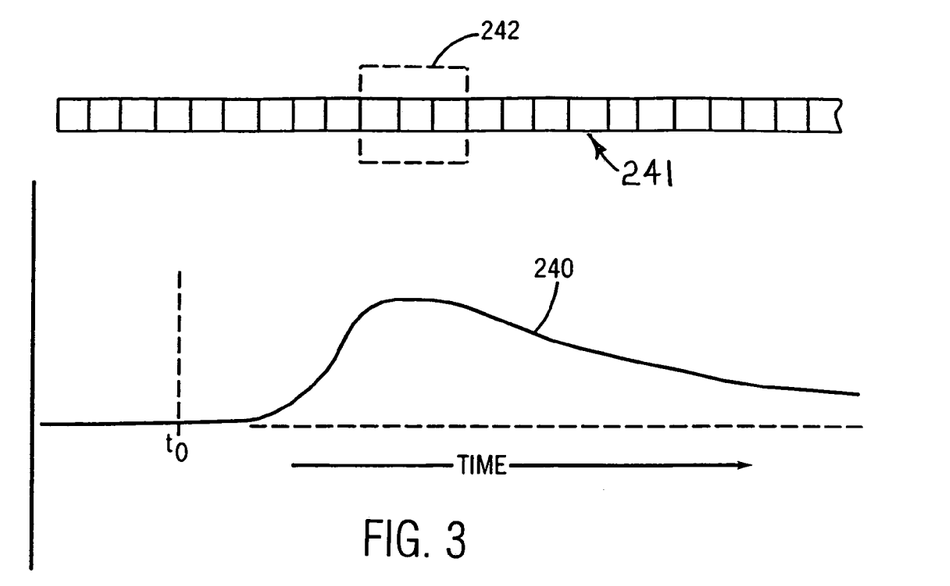
FIG. 3 is a graphic representation of a CEMRA dynamic study using the pulse sequence of FIG. 2.

A CEMRA dynamic study which exploits the 3D projection reconstruction method is illustrated in FIG. 3, where the curve 240 indicates contrast enhancement in the vasculature of interest after a contrast agent is injected at time $t_0$. The pulse sequence of FIG. 2 is used to acquire sets of interleaved projections that sample directions throughout a sphere of k-space. Each unique set of projections adequately samples the central region of k-space, but undersamples the peripheral regions. Acquisition begins at a time prior to contrast arrival and lasts for a period of time well beyond the peak signal contrast. The readout gradients are stepped through values as described above to sequentially acquire the succession of interleaved projection data sets indicated at 241.

All of the k-space data sets acquired during the dynamic study are stored. Typically, a mask image is produced by combining the k-space samples from view sets acquired prior to contrast arrival and an image is reconstructed as described above. The mask image may be subtracted from contrast enhanced images to remove non-vascular structures. However, by employing the present invention one does not need such a mask image and the start of the data acquisition sequence can be delayed until contrast arrival in the vasculature of interest.

Figure 4:
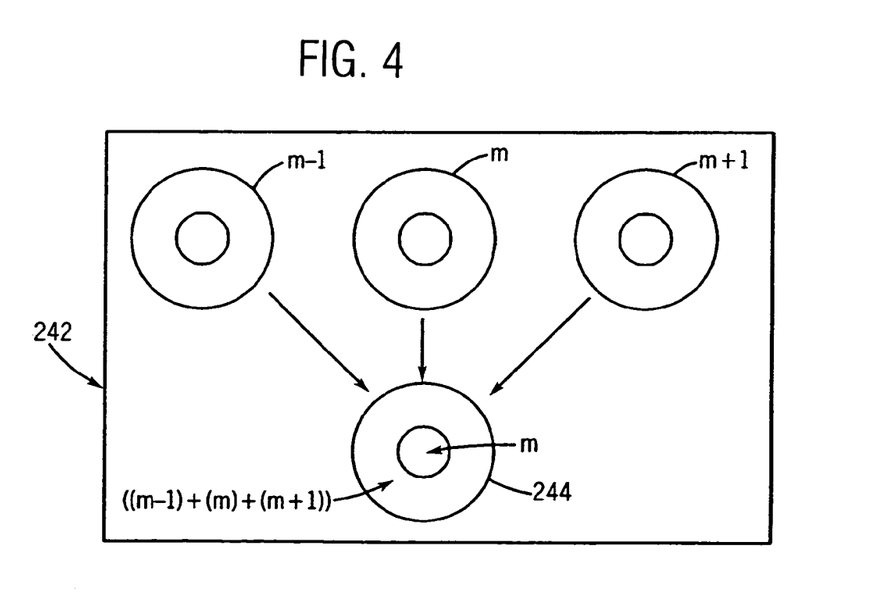
FIG. 4 is a pictorial representation of the method used to form image data sets from the acquisitions in the CEMRA dynamic study of FIG. 3.

Referring particularly to FIGS. 3 and 4, a contrast enhanced image may be produced by first sliding a data window 242 to any point (m) along the data sets 241 acquired during the dynamic study. In this example the data window 242 encompasses three acquired data sets 241. As shown in FIG. 3, the data window 242 may, for example, be aligned with the peak in arterial enhancement, although it can be appreciated that the window location m may be centered on any set of views acquired during the dynamic study.

An image is reconstructed by combining the k-space data from the sets of views within the data window 242. This is accomplished by using all of the k-space data in the center view set m plus the peripheral k-space data from adjacent view sets m−1 and m+1. The central region of the view set m is fully sampled and it accurately depicts the image enhancement occurring at its acquisition time during the study. The undersampled peripheral region surrounding the center is filled in with peripheral data from the adjacent view sets at m−1 and m+1. As a result, a fully sampled image data set 244 is formed which depicts the vasculature of interest at time m during the dynamic study.

Other, more sophisticated methods can also be used to combine the acquired undersampled projection data sets. To improve the image SNR the size of the sliding window 242 can be increased to include more acquired data sets 241. To retain the time resolution of the reconstructed image, however, a temporal filter is used to select the k-space data to be combined. More particularly, at the edge of k-space the filter has a wide aperture to include peripheral k-space data from all the data sets in the window 242, and as one moves closer to the center of k-space, this aperture narrows until only the k-space data from the view set m is included for the fully sampled central k-space region. In other words, rather than the two-step aperture narrowing illustrated in FIG. 4 for a three data set window 242, more data sets 241 can be included in the window 242 and the filter aperture may be narrowed in many steps.

Figure 5A:
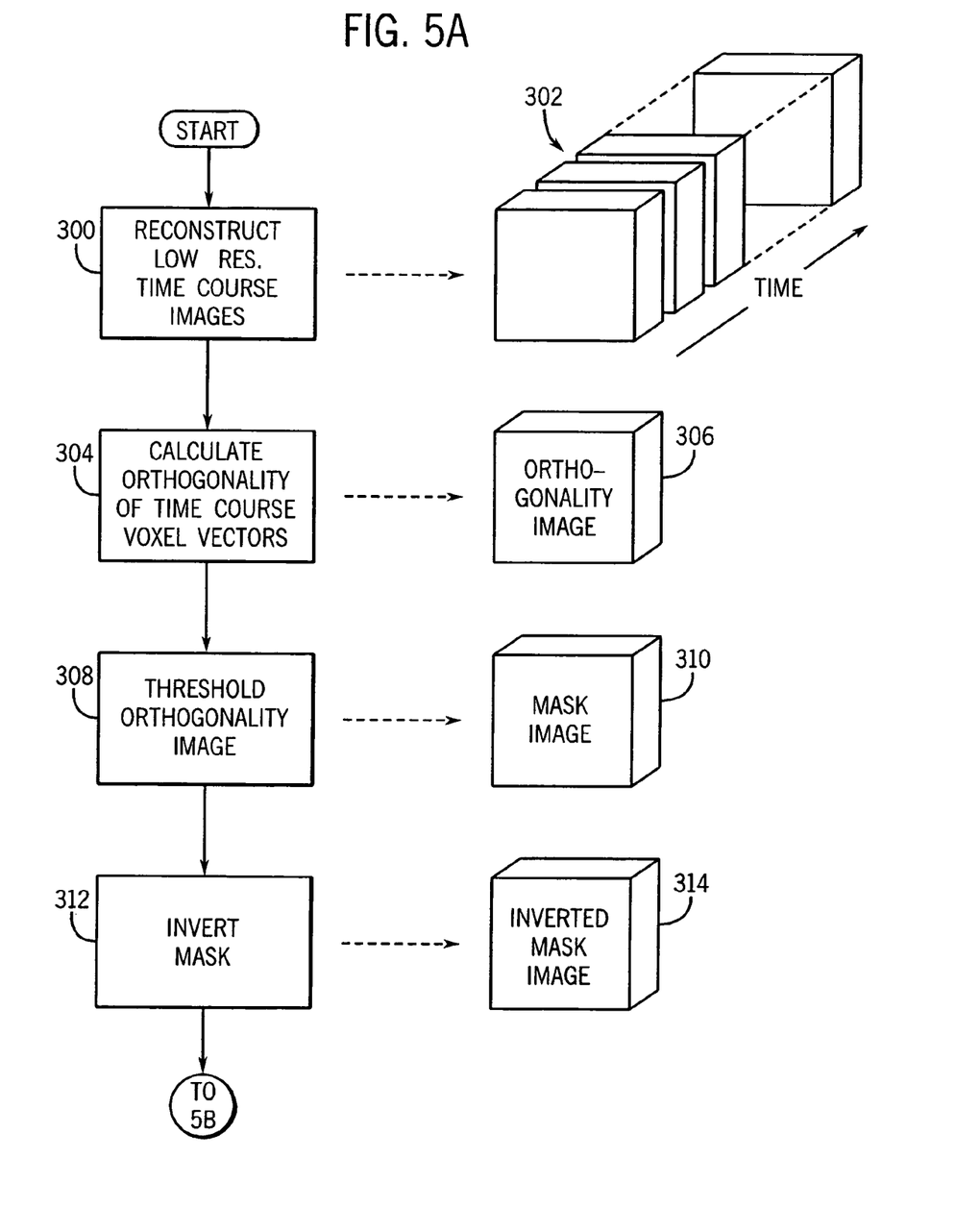
FIGS. 5A-C is a flow chart of the steps employed to segment images acquired during the CEMRA study of FIG. 3.
Figure 5B:
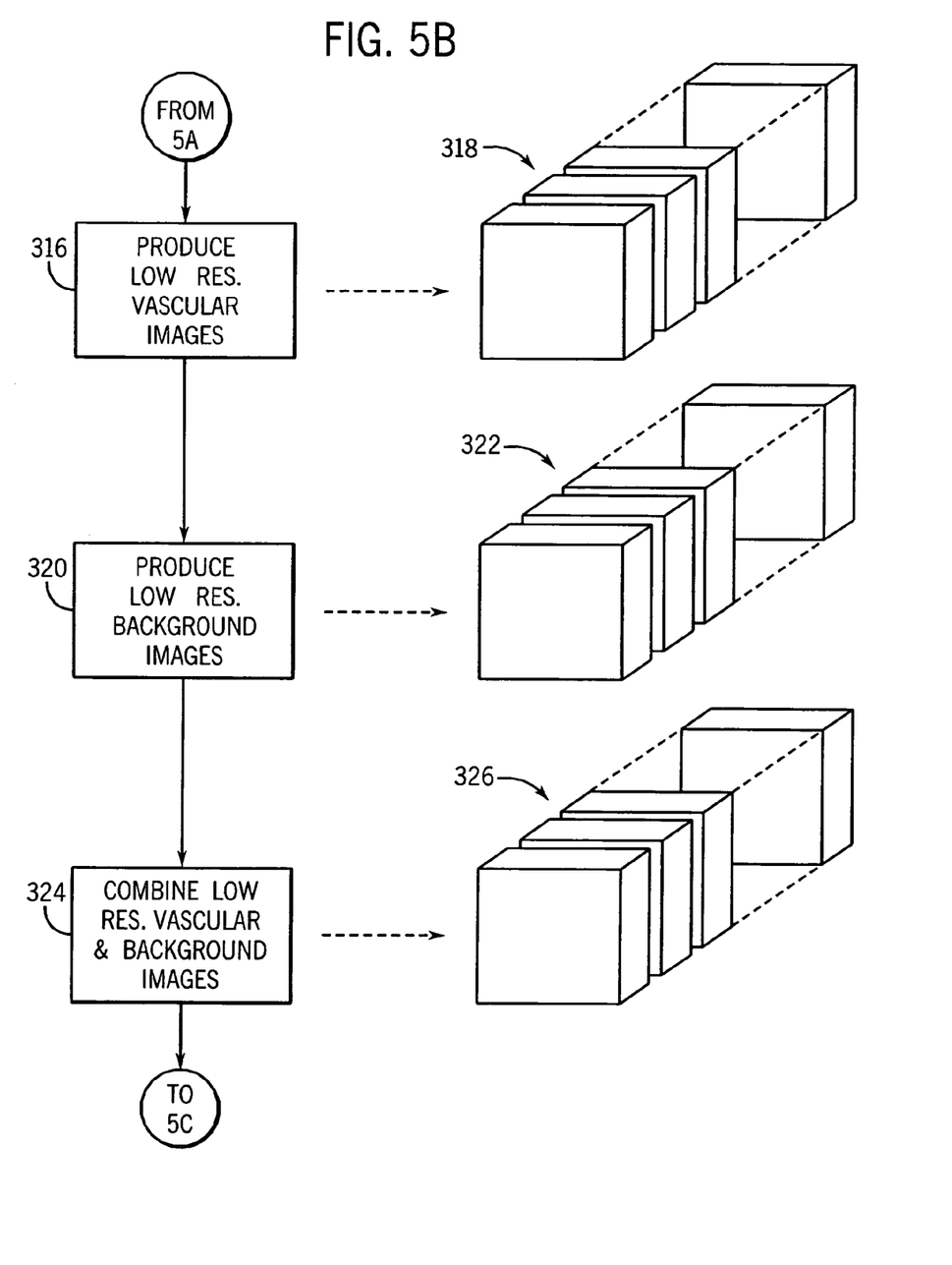
Figure 5C:
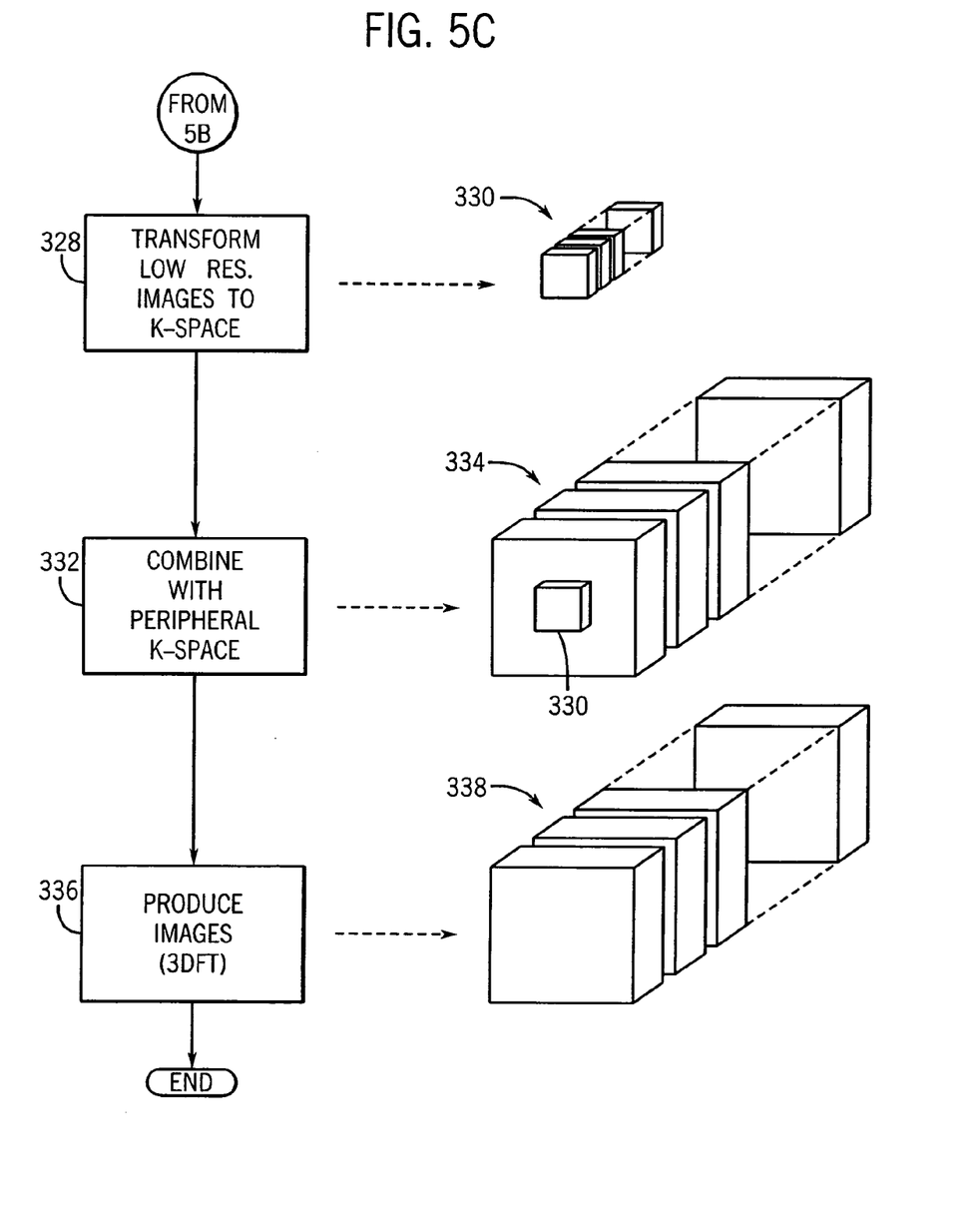

The present invention is a method of segmenting the images reconstructed from the data acquired during the CEMRA dynamic study to significantly reduce the brightness of non-vascular pixels in the images. As indicated above, traditionally this is accomplished by acquiring a mask image prior to contrast enhancement of the vasculature and subtracting the mask from the contrast enhanced images. The present method uses the information acquired during the dynamic study to identify those image pixels which are not vascular and then suppress the brightness of these pixels. The steps of this method are illustrated in the flow chart of FIG. 5. These steps are performed under the direction of a program executed by the computer system 107 on the series of regridded k-space data sets acquired as described above during a dynamic study.

Referring particularly to FIG. 5A, the first step, as indicated by process block 300, is to reconstruct a time course series of low resolution images 302 using a fully sampled central k-space region from each of the n acquired data sets. In a typical study n will range from 10 to 40. This is accomplished using the regridded k-space data and, for example, selecting the central 64×64×64 k-space samples. The low resolution image 302 is produced by performing a 3D Fourier transformation on this central region k-space data set.

The resulting n low resolution images 302 depict how the intensity of each image voxel changes during the time period of the dynamic study. A voxel which depicts vascular tissue will display an enhancement curve over time which is similar to the curve 240 in FIG. 3. A voxel which depicts regions outside the subject or regions which do not receive blood during the dynamic study will have a static, or unchanging brightness level. And finally, background tissues which slowly receive blood via perfusion will demonstrate a linearly increasing brightness level during the study. These differences are detected by analyzing voxel vectors $\vec{b}$ formed by corresponding pixels in each of the succession of low resolution images 302.

The next step as indicated by process block 304 is to measure the degree to which each time course voxel vector $\vec{b}$ is orthogonal with model signals to produce an orthogonality image 306. As will be described below in detail, this measurement of orthogonality is performed with a matrix which is the orthogonal complement of a matrix comprised of signals that model both static voxels and background tissue voxels. As a result, the orthogonality image 306 displays pixels which are not static or background tissues with greater intensity. Vascular pixels are thus displayed with high intensity and static/background pixels are displayed at a lower intensity.

As indicated at process block 308, the next step is to identify each voxel in the orthogonality image 306 which has an intensity value in excess of a calculated threshold ($t_2$). A mask image 310 is produced in which each pixel corresponding to pixels in the orthogonality image 306 having values greater than the threshold $t_2$ are set to "one" and the remaining pixels are set to "zero". The image mask 310 indicates the location of vascular voxels.

As indicated at process block 312, an inverted mask image 314 is produced by reversing all the "ones" and "zeros" in a copy of the mask image 310. The inverted mask image 314 indicates the location of static and background voxels.

As indicated at process block 316 in FIG. 5B, the mask image 310 is applied to a copy of each of the n low resolution images 302 to produce n corresponding low resolution vascular images 318. This is simply a multiplication of each pixel value in a low resolution image 302 by its corresponding pixel in the mask image 310 (i.e., "1" or "0"). Then low resolution vascular images 318 depict vascular enhancement during the dynamic study.

As indicated at process block 320, a set of n low resolution background images 322 are then produced by applying both the inverted mask image 314 and the orthogonality image 306 to a copy of each of the n low resolution images 302. In this step each low resolution image pixel is multiplied by the corresponding pixel in the inverted mask image 314 (i.e., "1" or "0") and multiplied again by the corresponding pixel value in the orthogonality image 306. The resulting n images 322 depict static and background pixels during the dynamic study, but their brightness is suppressed by weighting factors corresponding to values in the orthogonality image 306. The lower the orthogonality between a pixel's time course voxel vector and the model, the greater the suppression of the pixel's brightness.

It should be apparent that a possible alternative embodiment of the invention is to simply set all the background voxels to zero rather than suppress their signals. In this case the inverted mask 314 and the low resolution background images 322 need not be produced.

The low resolution vascular and background images 318 and 322 are combined at process block 324 to produce a corresponding set of n low resolution filtered images 326. As shown in FIG. 5C, these are then transformed back to k-space at process block 328 by performing a 3D Fourier transformation on each. The resulting n filtered k-space center data sets 330 are then combined at process block 332 with the corresponding n original peripheral k-space data sets acquired during the dynamic study. The filtered k-space center data 330 is thus combined with the originally acquired and unfiltered peripheral k-space data to form n filtered and complete k-space data sets 334. Each of these filtered k-space data sets 334 are Fourier transformed at process block 336 to produce n high resolution images 338. These images depict the subject during the dynamic study, but static and background signals are suppressed to provide enhanced contrast of the arteries and veins.

An important step in the above method is the orthogonality calculation step 304 in which time course voxel vectors are compared with "model" signals to identify those voxels which behave like vascular voxels. In U.S. Pat. No. 6,381,486 the model signals are obtained by manually identifying an arterial voxel in a reconstructed image and using that voxel's time course voxel vector as a reference against which other voxels are correlated. This prior technique has two disadvantages. First, it requires the intervention of a trained practitioner to manually select an arterial voxel. Secondly, it has been found that arterial voxels can behave quite differently from each other during a CEMRA study and identifying one arterial voxel does not always insure that all arterial voxels are going to be successfully segmented. This is particularly true of diseased arteries which can exhibit unusual contrast enhancement characteristics. In the method according to the present invention the model signals are produced automatically and they do not attempt to model the behavior of arterial voxels.

Figure 6:
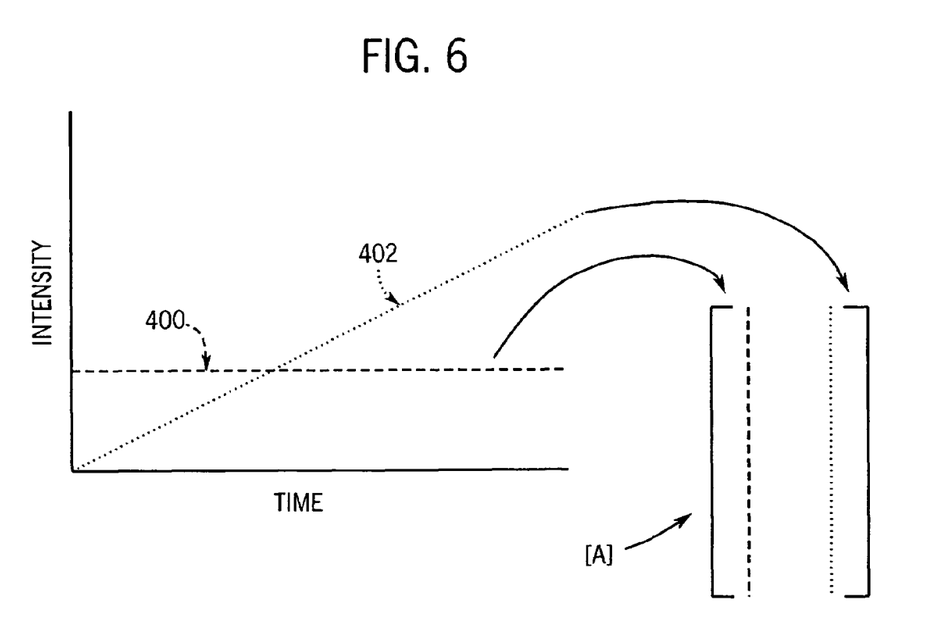
FIG. 6 is a graphic representation of model signals used to form a matrix used in the process of FIG. 5.

Referring particularly to FIG. 6, a n×2 matrix [A] of intensity values is formed using a model of the contrast enhancement signal from two typical types of non-vascular image voxels. The first model is that of static tissues as indicated by dashed line 400. These are tissues which do not receive blood and whose signals remain constant during the CEMRA dynamic study. These include:

fat
 bone
 air space
 muscle.

The second model is that of background tissues that slowly enhance in a substantially linear fashion as depicted by dotted line 402. Such tissues include, for example:

renal parenchyma
 liver parenchyma
 lung parenchyma.

As shown pictorially in FIG. 6, the two modeled time course signals 400 and 402 are used to form a n×2 matrix [A]. The orthogonal complement of the matrix [A] is calculated to form an n×(n−2) matrix $[A]^\perp$. When voxel vectors having n elements are correlated with this matrix $[A]^\perp$, we are measuring how dissimilar the voxel vector is from either static or background signals. The linear equation $$[A]^\perp * \vec{x} = \vec{b} \qquad (1)$$

is solved for the voxel vector $\vec{b}$ using the Singular Value Decomposition (SVD) method. The SVD method is a well known technique described by Kakarala et al "Signal Analysis Using A Multiresolution Form Of The Singular Value Decomposition", *IEEE Trans. Image Process* 10(2001), No. 5, 723-35, for solving linear equations when one is unsure of the quality of the data or the relation between the space of [A] and the vector $\vec{b}$. The norm of $\vec{x}$ is as follows: $x_{norm} = \sqrt{x_1^2 + x_2^2 + \ldots x_n^2}$, where $\vec{x}$ has n elements. The norm is the length of the vector $\vec{x}$. The vector $\vec{x}$ is a measure of the likelihood that the voxel vector $\vec{b}$ lies in the complement space $A^\perp$. The norm of the vector $\vec{x}$ is lower for static and background signals than for signals emanating from vascular voxels. Thus, the higher the norm value, the greater the probability that the voxel is not static material.

Another aspect of the present invention is the automatic calculation of a threshold value ($t_2$) used in the thresholding step 308 to create mask image 310. That is, voxel vectors having a norm value greater than a threshold value $t_2$ are to be characterized as vascular.

Figure 7:
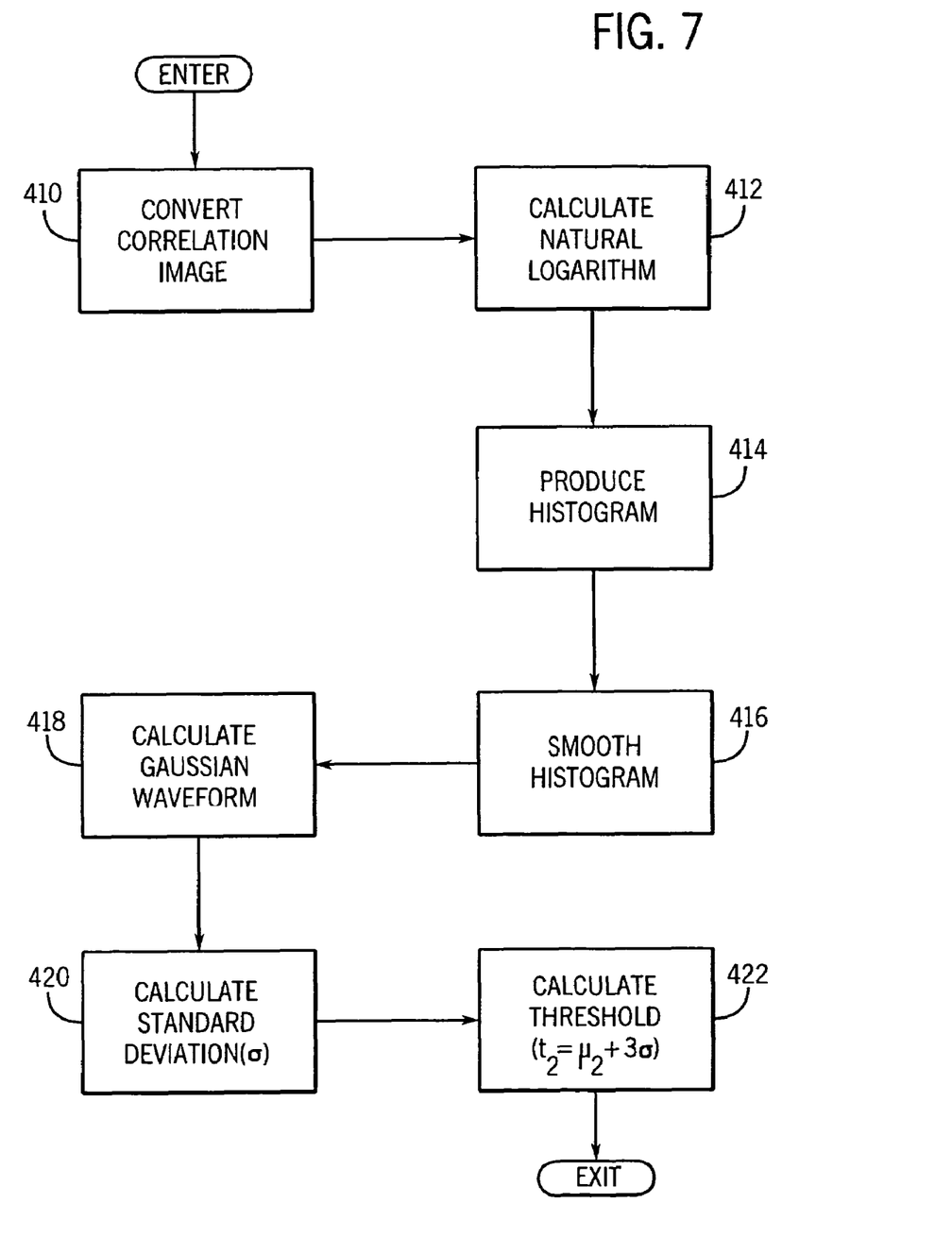
FIG. 7 is a flow chart of the steps employed to calculate a threshold used in the process of FIG. 5.
Figure 8:
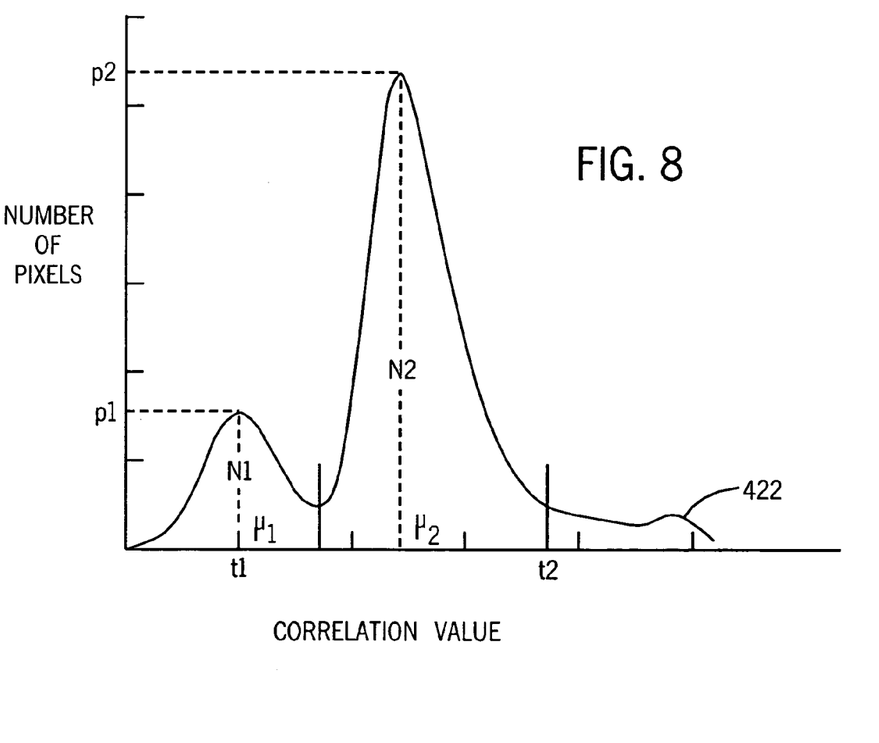
FIG. 8 is a graphic representation of a histogram produced during the calculation of the threshold in FIG. 7.

Referring particularly to FIG. 7, the threshold value $t_2$ is established by examining the values in the orthogonality image 306. The natural logarithm of each measure of orthogonality in the three-dimensional array 306 is calculated at process block 412 and a 256 bin histogram of these values is produced at process block 414. The natural logarithm has proved helpful in providing more dynamic range over the range of orthogonality measures of interest. As is known in the art, a histogram counts the number of pixels having values within selected ranges. This histogram is then smoothed at process block 416 with a digital lowpass filter to lessen the effects of noise. A graphic representation of such a histogram for a typical medical image is shown in FIG. 8 and it can be seen that it is characterized by two peaks $N_1$ and $N_2$ having respective peak values $P_1$ and $P_2$. $P_1$ pertains to the background pixels and $P_2$ pertains to the static and linearly enhancing pixels. The main peak, $P_2$, is detected and is fitted to a Gaussian waveform at process block 418. This is accomplished by moving left from the peak centered at $\mu_2$ and finding the point where the histogram is 50% of its peak $P_2$. The distance between peak $P_2$ and this point is used to calculate the standard deviation, $\sigma$, of the Gaussian curve at process block 420. A threshold is then established at process block 422 by calculating $t_2 = \mu_2 + 3\sigma$. This has been empirically shown to work well to separate enhancing vessels from other tissues.

It should be apparent that the present invention enables a time course series of CEMRA images to be automatically filtered to suppress signal from image voxels other than vascular voxels. No separate pre-contrast mask image need be acquired to practice this method. Instead, information gathered during the dynamic study is used to automatically identify and filter voxels that are not vascular.

In the preferred embodiment a 3D projection reconstruction (3DPR) acquisition is performed, but the invention is also applicable to other 3D and 2D acquisitions. The undersampled 3DPR acquisition is preferred because the center of k-space can be fully sampled at a higher frame rate during the dynamic study. This higher frame rate means that the time resolution of the n-element voxel vectors is increased and the correlation of them with the model matrix is a more accurate process.

Appendix A

Suppose that an image contains only two principal brightness regions. The histogram of such an image may be considered an estimate of brightness probability density function p(z). This overall density function is the sum or mixture of two unimodal densities, one for the light and one for the dark regions in the image. Furthermore, the mixture parameters are proportional to the areas of the picture for each brightness. If the form of the densities is know or assumed, determining an optimal threshold (in terms of minimum error) for segmenting the image into the two brightness regions is possible.

Suppose that an image contains two values combined with additive Gaussian noise. The mixture probability density function is $p(z)=P_1p_1(z)+P_2p_2(z)$ which, for the Gaussian case, is $$p(z) = \frac{P_1}{\sqrt{2\pi}\sigma_1}\exp[-\frac{(z-\mu_1)^2}{2\sigma_1^2}] + \frac{P_2}{\sqrt{2\pi}\sigma_2}\exp[-\frac{(z-\mu_2)^2}{2\sigma_2^2}]$$

where $\mu_1$ and $\mu_2$ are the mean values of the two brightness levels $\sigma_1$ and $\sigma_2$ are the standard deviations about the means, and $P_1$ and $P_2$ are the a priori probabilities of the two levels. The constraint $P1+P_2=1$ must be satisfied, so the mixture density has five unknown parameters. If all the parameters are known, the optimal threshold is easily determined. Suppose that the dark regions correspond to the background and the bright regions correspond to objects. In this case $\mu_1<\mu_2$, and a threshold T may be defined so that all pixels with a gray level below T are considered background pints and all pixels with a level above T are considered object points. The probability of erroneously classifying an object point as a background point is $E_1(T)=\int_{-\infty}^{T}p_2(z)dz$. Similarly, the probability of erroneously classifying a background point as an object point is $E_2(T)=\int_{T}^{\infty}p_1(z)dz$. Therefore the overall probability of error is $E(T)=P_2E_1(T)+P_1E_2(T)$. To find the threshold value for which this error is minimal requires differentiating E(T) with respect to T (using Liebnitz's rule) and equating the result to 0. Thus $P_1p_1(T)=P_2p_2(T)$. Applying this result to the Gaussian density, taking logarithms, and simplifying, gives the quadratic equation $AT^2+BT+C=0$ where $$A = \sigma_1^2 - \sigma_2^2$$
$$B = 2(\mu_1\sigma_2^2 - \mu_2\sigma_1^2)$$
$$C = \sigma_1^2\mu_2^2 - \sigma_2^2\mu_1^2 + 2\sigma_1^2\sigma_2^2\log\left(\frac{\sigma_2 P_1}{\sigma_1 P_2}\right)$$

The possibility of two solutions indicates that two threshold values may be required to obtain the optimal solution. If the variances are equal, $\sigma^2=\sigma_1^2=\sigma_2^2$, a single threshold is sufficient:

$$T = \frac{\mu_1\mu_2}{2} + \frac{\sigma^2}{\mu_1 - \mu_2}\log\left(\frac{P_2}{P_1}\right).$$

If the prior probabilities are equal, $P_2=P_2$, the optimal threshold is the average of the means. The same holds for $\sigma=0$. The determination of the optimal threshold may be similarly accomplished for other unimodal densities of known form, such as the Raleigh and log-normal densities.

The invention claimed is:

1. A method for producing a magnetic resonance image of a patient using a magnetic resonance imaging (MRI) system, the steps comprising:

a) injecting the patient with a contrast agent which flows into a region of interest in the patient;

b) acquiring NMR k-space data for a series of NMR time course images during a time resolved phase of an examination, during which the contrast agent makes a first passage through the patient's arteries in the region of interest;

c) reconstruct a series of corresponding low resolution time course images using a central portion of the NMR k-space data acquired in step b);

d) producing an orthogonality image by measuring the degree to which voxel vectors formed from data in corresponding voxels in the series of low resolution time course images are orthogonal to a model time course voxel vector;

e) producing a mask image by determining which voxels in the orthogonality image exceed a threshold;

f) producing a series of low resolution vascular images by multiplying the low resolution time course images by the mask;

g) transforming the series of low resolution vascular images to produce a corresponding series of filtered k-space center data sets;

h) combining a peripheral portion of the NMR k-space data acquired in step b) with the corresponding series of filtered k-space center data sets to form a series of filtered k-space data sets; and i) reconstructing an image by transforming a filtered k-space data set.

2. The method as recited in claim 1 in which a series of images are reconstructed in step i) by transforming the corresponding series of the filtered k-space data sets.

3. The method as recited in claim 1 in which the model time course voxel vector is produced with a method which comprises:

j) producing a matrix [A] having values which model the characteristic behavior of NMR signals produced by undesirable tissues during the performance of step b); and step d) includes calculating the orthogonal complement of the matrix $[A^\perp]$.

4. The method as recited in claim 3 in which the orthogonality image is produced in step d) by the equation $$[A]^\perp * \vec{x} = \vec{b}$$

where $\vec{b}$ =is a voxel vector; and $\vec{x}$ =is a value in the orthogonality image at the corresponding voxel location.

5. The method as recited in claim 1 in which the threshold is produced with a method which comprises:

l) producing a histogram using values related to values from the orthogonality image; and m) examining the histogram to establish a threshold which distinguishes vascular voxels from other voxels.

6. The method as recited in claim 5 in which step l) includes calculating the natural logarithm of the orthogonality image values.

7. The method as recited in claim 1 which further includes:

n) producing an inverted mask image;

o) producing a series of low resolution background images by multiplying the low resolution time course images by the inverted mask;

p) weighting the low resolution background images to suppress the values therein; and q) combining the low resolution background images with the corresponding low resolution vascular images.

8. The method as recited in claim 7 in which step p) is performed using values from the orthogonality image.

9. The method as recited in claim 1 in which step b) is performed using a 3D projection reconstruction pulse sequence.

10. A method for producing a magnetic resonance image of a patient using a magnetic resonance imaging (MRI) system, the steps comprising:
  a) injecting the patient with a contrast agent which flows into a region of interest in the patient;
  b) acquiring NMR k-space data for a series of NMR time course images during a time resolved phase of an examination, during which the contrast agent makes a first passage through the patient's arteries in the region of interest;
  c) reconstruct a series of corresponding low resolution time course images using a central portion of the NMR k-space data acquired in step b);
  d) producing a model time course voxel vector which is indicative of NMR signals produced by undesired tissues;
  e) suppressing the signals in voxels of the low resolution time course images which have time course voxel vectors that do not differ significantly from the model time course voxel vector;
  f) transforming the series of low resolution images to produce a corresponding series of filtered k-space center data sets;
  g) combining a peripheral portion of the NMR k-space data acquired in step b) with the corresponding series of filtered k-space center data sets to form a series of filtered k-space data sets; and
  h) reconstructing an image by transforming a filtered k-space data set.

11. The method as recited in claim 10 in which the model time course voxel vector is a matrix [A] having values which model the characteristic behavior of a plurality of NMR signals produced by undesirable tissues and the difference between the model time course voxel vector and time course voxel vectors is measured using the orthogonal complement $[A^\perp]$ of the matrix [A].

12. The method as recited in claim 10 in which the model time course voxel vector models the behavior of NMR signals having a substantially constant value during the performance of step b).

13. The method as recited in claim 10 in which the model time course voxel vector models the behavior of NMR signals that ramp up in value during the performance of step b).

14. The method as recited in claim 12 in which the model time course voxel vector also models the behavior of NMR signals that ramp up in value during the performance of step b).

* * * * *